United States Patent
Selvidge et al.

(10) Patent No.: US 10,925,186 B2
(45) Date of Patent: Feb. 16, 2021

(54) VERTICAL LIFT HEAT TRANSFER DEVICE FOR PLUGGABLE MODULES

(71) Applicant: HEWLETT PACKARD ENTERPRISE DEVELOPMENT LP, Houston, TX (US)

(72) Inventors: David A. Selvidge, Houston, TX (US); Pinche Tsai, Houston, TX (US); Minh H. Nguyen, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/413,325

(22) Filed: May 15, 2019

(65) Prior Publication Data
US 2020/0367387 A1  Nov. 19, 2020

(51) Int. Cl.
*H05K 7/20* (2006.01)
*H05K 7/18* (2006.01)
*H05K 7/14* (2006.01)
*G11B 33/12* (2006.01)

(52) U.S. Cl.
CPC ....... *H05K 7/20772* (2013.01); *G11B 33/122* (2013.01); *H05K 7/1487* (2013.01); *H05K 7/20509* (2013.01); *H05K 7/1452* (2013.01); *H05K 7/20718* (2013.01)

(58) Field of Classification Search
CPC ............. G11B 33/122; H05K 7/20772; H05K 7/1487; H05K 7/20509; H05K 7/1452; H05K 7/20718
See application file for complete search history.

(56) References Cited

U.S. PATENT DOCUMENTS

| | | | | |
|---|---|---|---|---|
| 5,067,041 A * | 11/1991 | Cooke | ..................... | G06F 1/182 361/679.4 |
| 5,767,999 A * | 6/1998 | Kayner | ................. | G06F 13/409 398/164 |
| 6,302,737 B1* | 10/2001 | Billman | ............. | H01R 12/7029 439/607.23 |
| 6,351,394 B1* | 2/2002 | Cunningham | ..... | H01R 13/4536 361/818 |
| 6,454,580 B1* | 9/2002 | Hwang | ................ | G02B 6/4277 439/138 |

(Continued)

OTHER PUBLICATIONS

Cooliit Systems, Inc., "Passive Coldplates Loop", available online at <https://web.archive.org/web/20180625023714/https://www.coolitsystems.comipassive-coldplate-loop/>, Jun. 25, 2018, 5 pages.

*Primary Examiner* — Binh B Tran
*Assistant Examiner* — Michael A Matey
(74) *Attorney, Agent, or Firm* — McDermott Will & Emery

(57) ABSTRACT

Embodiments are directed to an assembly including a bay structure including a bay structure that defines a bay for receiving a pluggable module and including sides and a front plate rotatably connected to the sides, a connecting bracket coupled with the bay structure, and a heat transfer device coupled with the bay structure. The bay structure, the heat transfer device, and the connecting bracket are configured such that rotating the front plate from a first position to a second position displaces the connecting bracket in a first direction which causes the connecting bracket to displace the heat transfer device in a second direction transverse to the first direction.

20 Claims, 6 Drawing Sheets

(56) References Cited

U.S. PATENT DOCUMENTS

| | | | |
|---|---|---|---|
| 6,533,603 B1* | 3/2003 | Togami | G02B 6/4246 439/157 |
| 6,538,882 B2* | 3/2003 | Branch | H01R 13/6275 361/679.02 |
| 6,687,126 B2 | 2/2004 | Patel et al. | |
| 6,788,540 B2* | 9/2004 | Kruger | G02B 6/4201 361/719 |
| 6,884,097 B2* | 4/2005 | Ice | G02B 6/4201 361/728 |
| 6,942,506 B2* | 9/2005 | Kimura | H01L 23/4093 174/16.3 |
| 6,986,679 B1* | 1/2006 | Aronson | H01R 25/00 439/170 |
| 7,052,306 B2* | 5/2006 | Ishigami | G02B 6/4201 439/372 |
| 7,090,519 B2* | 8/2006 | Muramatsu | H01R 13/6335 439/159 |
| 7,090,523 B2* | 8/2006 | Shirk | G02B 6/4246 439/352 |
| 7,255,484 B2* | 8/2007 | Walker, Jr. | G02B 6/4246 385/53 |
| 7,448,921 B2* | 11/2008 | Kim | G06K 7/0013 361/715 |
| 7,518,870 B2* | 4/2009 | Choi | H05K 5/0265 361/702 |
| 7,965,509 B2 | 6/2011 | Campbell et al. | |
| 8,223,498 B2* | 7/2012 | Lima | H05K 7/20418 361/704 |
| 8,274,787 B2 | 9/2012 | Alyaser et al. | |
| 8,534,930 B1* | 9/2013 | Lima | G02B 6/426 385/14 |
| 8,638,559 B2 | 1/2014 | Barina et al. | |
| 8,885,342 B2* | 11/2014 | Skepnek | H01L 23/367 174/548 |
| 8,911,244 B2* | 12/2014 | Elison | H05K 7/20409 439/137 |
| 8,917,518 B2 | 12/2014 | Hu et al. | |
| 9,245,820 B2 | 1/2016 | Goldrian et al. | |
| 9,468,129 B1 | 10/2016 | Wang | |
| 9,786,578 B2 | 10/2017 | Cox et al. | |
| 10,021,814 B2 | 7/2018 | Aoki et al. | |
| 10,111,365 B1 | 10/2018 | Junkins et al. | |
| 10,222,844 B1* | 3/2019 | Reddy | G06F 1/183 |
| 10,310,198 B1* | 6/2019 | Yatskov | G02B 6/4261 |
| 2003/0044129 A1* | 3/2003 | Ahrens | G02B 6/389 385/92 |
| 2003/0171016 A1* | 9/2003 | Bright | G02B 6/4201 439/160 |
| 2004/0101257 A1* | 5/2004 | Kruger | G02B 6/3897 385/92 |
| 2004/0219819 A1* | 11/2004 | Di Mascio | G02B 6/4292 439/352 |
| 2004/0226689 A1* | 11/2004 | Thompson | F28D 15/0233 165/80.2 |
| 2005/0162834 A1* | 7/2005 | Nishimura | H05K 5/0265 361/710 |
| 2005/0220425 A1* | 10/2005 | Kropp | G02B 6/4292 385/88 |
| 2007/0064385 A1 | 3/2007 | Paul et al. | |
| 2008/0247762 A1* | 10/2008 | Yoshikawa | G02B 6/4246 398/138 |
| 2009/0279831 A1* | 11/2009 | Luo | H01R 13/6335 385/53 |
| 2009/0296351 A1* | 12/2009 | Oki | G02B 6/4201 361/709 |
| 2011/0209855 A1 | 9/2011 | Peterson et al. | |
| 2012/0052720 A1* | 3/2012 | David | H01R 13/6471 439/487 |
| 2012/0275120 A1* | 11/2012 | Nguyen | G02B 6/4292 361/747 |
| 2015/0092354 A1* | 4/2015 | Kelty | H05K 7/20563 361/722 |
| 2016/0174415 A1* | 6/2016 | Ito | G02B 6/42 361/715 |
| 2017/0215297 A1* | 7/2017 | Young | H05K 7/1489 |
| 2017/0293326 A1* | 10/2017 | Lin | G06F 1/181 |
| 2018/0123268 A1* | 5/2018 | Leigh | G02B 6/4277 |

\* cited by examiner

VERTICAL LIFT HEAT TRANSFER DEVICE FOR PLUGGABLE MODULES

BACKGROUND

Some computing components (hereinafter "pluggable modules") are designed to be easily plugged into and removed from a system by a user during normal usage. Such pluggable modules generally include features to enable easy installation/removal, such as blind-mate electrical connectors that allow the module to be electrically connected into the system without the user needing to directly observe/control the mating of the electrical connectors. Some pluggable modules are hot-pluggable, meaning they can be plugged into or removed from a system while the system is running without requiring a system restart. Examples of pluggable modules include storage drives (e.g., hard disk drives, solid state drives, etc.), electro-optical transceiver modules (e.g., C form-factor pluggable (CFP) modules, Small form-factor pluggable (SFP) modules, Quad small form-factor (QSFP) modules, etc.), switch modules, and so on.

Pluggable modules, such as hard disk drives for a file server or other type of computer for example, are often mounted, in a vertically or horizontally stacked array, in a rectangular sheet metal "cage" structure which may be disposed within the computer housing or externally thereto. For operational convenience and flexibility, the modules may be "hot plug" connected within the cage. This type of electrical connection permits any of the supported modules to be removed and re-installed within the cage without disturbing the operation of the other modules. Some modules, such as storage drives may be supported on a carrier structure which is slidably and removably insertable into a bay of the cage to mate an electrical connector on a rear portion of the drive or its carrier structure with a corresponding electrical connector on a back plane circuit board at the rear interior side of the cage.

The description provided in the background section should not be assumed to be prior art merely because it is mentioned in or associated with the background section. The background section may include information that describes one or more aspects of the subject technology.

BRIEF DESCRIPTION OF THE DRAWINGS

The following figures are included to illustrate certain aspects of the embodiments, and should not be viewed as exclusive embodiments. The subject matter disclosed is capable of considerable modifications, alterations, combinations, and equivalents in form and function, as will occur to those skilled in the art and having the benefit of this disclosure.

DETAILED DESCRIPTION

Figure 1:
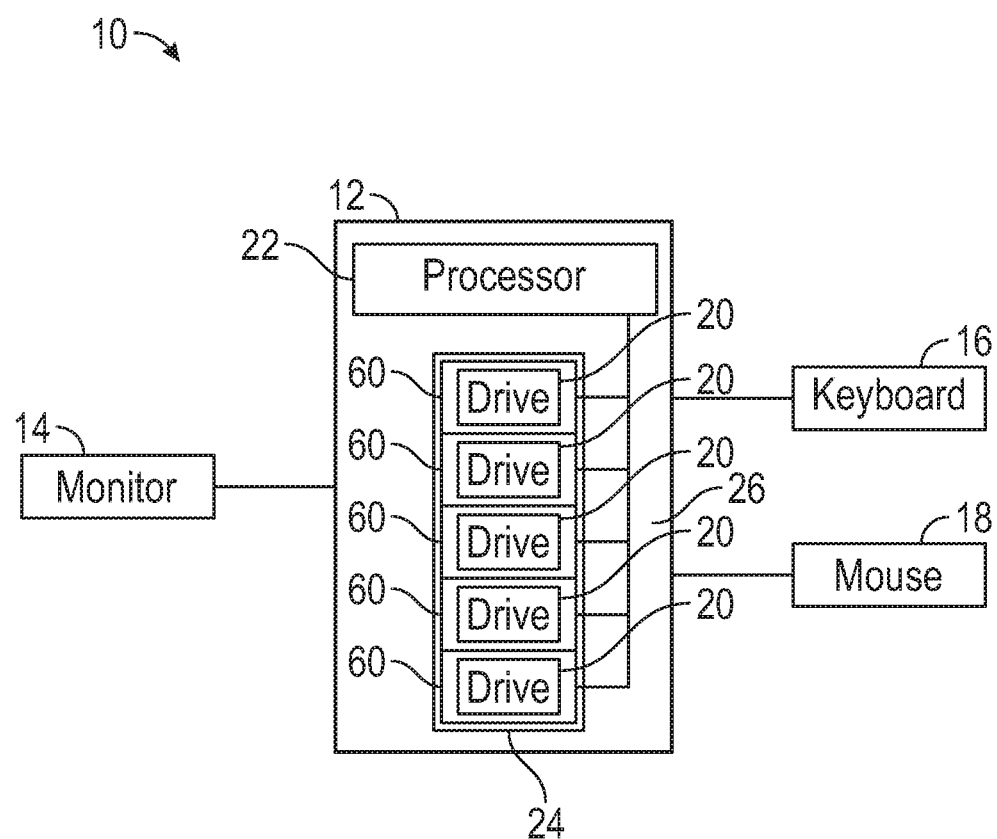
FIG. 1 is a schematic diagram of a representative computer system embodying principles disclosed herein.

In the following detailed description, numerous specific details are set forth to provide a full understanding of the present disclosure. It will be apparent, however, to one ordinarily skilled in the art, that the embodiments of the present disclosure may be practiced without some of these specific details. In other instances, well-known structures and techniques have not been shown in detail so as not to obscure the disclosure.

General Overview

Pluggable modules, like any other computing components, generate heat, and thus may need some form of cooling system to remove the heat. In some systems, pluggable modules are cooled simply by allowing air to flow over, around, and/or through the modules. However, in some computing systems, this conventional cooling approach may not be sufficient to cool some pluggable modules. For example, in some computing systems with higher device power levels, merely flowing air over the modules might not provide sufficient cooling. As another example, in a fan-less computing system, flowing air over the computing modules might not be possible at all. Moreover, because pluggable modules are supposed to be easily installable and removable from the system by a user post-manufacture, it may be desirable for the cooling system to facilitate the easy installation and removal of the component. This property of cooling systems is desirable in storage devices, such as hot-pluggable devices including hard disk drives (HDD), solid-state drives (SSD), or non-volatile memory express (NVMe) drives, which are configured for easy insertion and removal from the computer system without significant interruption to the operation of the computer system.

One approach to cooling the pluggable modules is to use a heat transfer device (such as a liquid-cooled cold plate) that is arranged within a bay so as to contact the pluggable module as the module is slid into the bay, thereby thermally coupling the heat transfer device to a surface of the pluggable module. The heat transfer device may then remove heat from the pluggable module. In some cases, a thermal interface material is disposed between the pluggable module and the heat transfer device for more effective cooling of the pluggable module. One drawback of this approach is that a user may be required to exert additional force while inserting the module into (or removing the module from) the bay due to the contact between the module and the heat transfer device as the module is slid into the bay. For example, there may be friction as the module slides relative to the heat transfer device, and/or opposing spring forces if the heat transfer device is spring mounted. Another drawback of this approach is that the thermal interface material may be damaged by contacting the pluggable module, the heat transfer device, and/or the cage when inserting or removing the pluggable module.

In another approach to cooling the pluggable modules, the heat transfer device may be configured to rotate. This may enable the heat transfer device to be rotated out of the way of the pluggable module as the pluggable module is inserted into or removed from the bay, and then be rotated into a position where it engages the pluggable module once the module is fully inserted. This may mitigate some of the drawbacks of the first approach. For example, because the heat transfer device is out of the way of the pluggable module as it is inserted/removed, there is no increase in the insertion/removal force and the risk of damage to the thermal interface material when inserting or removing the module can be minimized. However, one possible drawback of this approach is that one end of the heat transfer device may need to move a relatively long distance as it rotates to ensure adequate separation between the heat transfer device and the storage device. Typically, a computer system employs a relatively large number of pluggable modules, such as storage devices, and providing an area around the module sufficiently large to accommodate the rotating heat transfer device increases the space required to occupy the modules in the computer server and thereby increases the size of the computer server. It is therefore beneficial, in some circumstances, to reduce the distance the heat transfer device has to separate from the modules in order to insert or remove the modules.

Accordingly, embodiments disclosed herein provide an improved cooling system for cooling the pluggable modules that solve some of the issues noted above. In particular, example cooling systems disclosed herein use a heat transfer device that allows for easy insertion and removal of pluggable modules without damaging the thermal interface material and with minimal disruption to the cooling system. According to example embodiments disclosed herein, the system displaces the heat transfer device vertically from the pluggable module such that the thermal interface material (which may be attached to the heat transfer device or the module) does not interfere when inserting or removing the module. As a result, the storage device can be inserted or removed without damaging the thermal interface material. The distance that the heat transfer device has to move vertically in example embodiments is substantially less than the distance the heat transfer device of the second approach noted above has to rotate to create adequate separation between the heat transfer device and the module. As a result, the space required for each bay in example embodiments is less than that in the second approach noted above.

In an embodiment, an assembly as disclosed herein includes a bay structure including a front plate rotatably connected to two sidewalls, a connecting bracket coupled with the bay structure such that it can move along a first direction (e.g., horizontally) relative to the bay structure, and a heat transfer device coupled with the bay structure such that it can move along a second direction (e.g., vertically) relative to the bay structure. The bay structure is to be affixed within a computing system (e.g., in a drive cage) and defines a bay into which a pluggable module may be inserted. In some examples, the assembly further includes a thermal interface material coupled with the heat transfer device. The heat transfer device and the connecting bracket are configured such that rotating the front plate from a first position to a second position displaces the connecting bracket along the first direction which causes the connecting bracket to displace the heat transfer device along the second direction. For example, the front plate may include a cam (protrusion) that pushes the connecting bracket rearward when the front plate is rotated upward, and the connecting bracket and heat transfer devices may include opposing and complimentary ramped (sloped) surfaces configured such that when the connecting bracket moves reward it forces the heat transfer device upward. Thus, the heat transfer device may be moved between an engaged position in which it can thermally couple with a pluggable module installed in the bay, and a disengaged position in which it is disengaged from the pluggable module and does not interfere with the pluggable module or the thermal interface material as the module is installed in or removed from the bay.

In another embodiment, a method as disclosed herein includes rotating a front plate of a bay structure from a first position to a second position. The bay structure includes a front plate rotatably connected to two sidewalls. Rotating the front plate displaces a connecting bracket coupled with the bay structure in a first direction (e.g., horizontally) relative to the bay structure. Additionally, rotating the front plate displaces a heat transfer device coupled to carrier structure along a second direction (e.g., vertically) relative to the bay structure. The second direction is transverse to the first direction. The bay structure is to be affixed within a computing system (e.g., in a drive cage) and defines a bay into which a pluggable module may be inserted. The heat transfer device and the connecting bracket are configured such that rotating the front plate from a first position to a second position displaces the connecting bracket along the first direction which causes the connecting bracket to displace the heat transfer device along the second direction.

In still another embodiment, an assembly as disclosed herein includes a bay structure that defines a bay and includes a front plate rotatably connected to the bay structure, a hot-pluggable storage device disposed in the bay, a connecting bracket coupled with the bay structure, and a heat transfer device coupled with the bay structure. The heat transfer device and the connecting bracket are configured such that rotating the front plate in first direction displaces the connecting bracket in a second direction, displaces the heat transfer device in a third direction, and causes the heat transfer device to move to a disengaged position in which the heat transfer device does not contact the hot-pluggable storage device. The third direction is transverse to the second direction.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive. In the description below, the pluggable modules are described as storage drives as an illustrative example, but it should be understood that any type of pluggable module could be used in place of the storage drives, with simple modification of the dimensions of the parts of the bay structure to fit differently sized and shaped pluggable modules.

Example System Architecture

FIG. 1 is a schematic diagram of a representative computer system 10 embodying principles disclosed herein. As illustrated, the computer system 10 includes a computing device 12 that comprises a processor 22 and one or more bay assemblies 60. The bay assemblies 60 may be arranged in a cage structure 24, with each defining a bay in which a storage drive 20 may be removably installed. When the storage drives 20 are installed in the bays, they are communicably connected with the processor 22. In some examples, the computer system may also include peripherals, such as a monitor 14, a keyboard 16, and a pointing device, representatively in the form of a mouse 18. The storage drives 20 may include devices for storing data received from and retrieving stored data for the processor 22. The processor 22 may include any processing resource, such as a central processing unit (CPU), microprocessor, system-on-chip (SoC), graphics processing unit (GPU), storage array controller, RAID controller, cluster manager, application-specific-integrated-circuit (ASIC), complex-programmable-logic-device (CPLD), field-programmable-gate-array (FPGA), etc.

Each storage drive 20 can be removably positioned within a bay defined by one of the bay assemblies 60 within a support housing, illustrated as a sheet metal cage structure 24. In some examples, the cage structure 24 is positioned within a housing 26 of the computing device 12. In other embodiments, the cage structure 24 is located external to the housing 26 within a separate rack housing (not shown) and the storage drives 20 are communicable coupled to the processor 22. Although the storage drives 20 have been illustrated as being vertically stacked, in other embodiments, the storage drives 20 are positioned in a horizontally stacked array in which the cage structure 24 is oriented horizontally instead of being vertically oriented, as in FIG. 1. In other examples, the bays may have other arrangements, such as some bays being vertically stacked while others are horizontally stacked. Moreover, the bays may be oriented within the cage structure 24 in any manner, such as some bays being horizontally oriented within the cage structure 24 while other bays within the same cage are vertically oriented within the cage structure 24.

Figure 2:
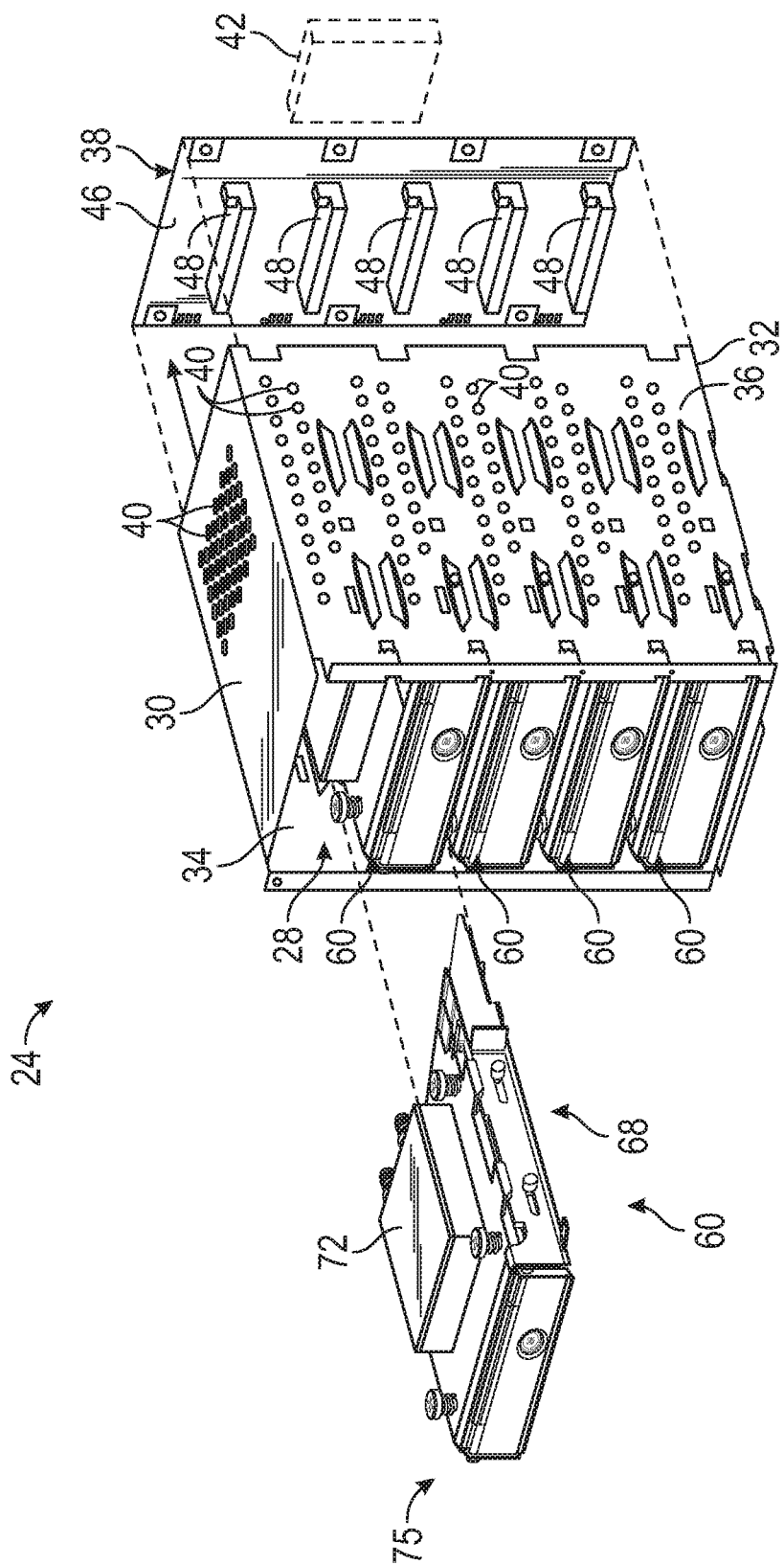
FIG. 2 is a partially exploded perspective view of the cage structure in FIG. 1 including the plurality of disk drives operatively supported therein and hot plug-connected.

FIG. 2 is a partially exploded perspective view of the cage structure 24 including bay assemblies 60 that may employ the principles of the present disclosure. As illustrated, the sheet metal cage structure 24 functions as a support housing and is of a vertically elongated rectangular configuration having an open front side 28, a top wall 30, a bottom wall 32, a left wall 34, and a right wall 36, and a backplane structure 38 extending along its rear side.

In some examples, ventilation holes 40 are formed in the top wall 30, left wall 34, and right wall 36, and a fan 42 is operatively disposed behind the backplane structure 38 to circulate cooling air within the housing 26. As discussed below, each storage drive 20 is provided with a heat transfer device for cooling the storage drive 20, which may be, for example, a liquid-cooled cold plate, and therefore the fan 42 and ventilation holes 40 are not necessarily provided to cool the drives 20. However, in some examples the fan 42 provides cooling to other heat sources (e.g., the processor 22, LEDs, GPUs, etc.) in the computing device 12.

The backplane structure 38 provides electrical connections to the bays for powering and/or communicating with the drives 20. Specially, the backplane structure 38 may be a rigid body (e.g., a printed circuit board, metal mesh, etc.) that supports electrical connectors 48, with one connector 48 for each bay assembly 60. The electrical connectors 48 provide electrical connectivity to a drive 20 installed in the bay assembly 60, such as communicably connecting the drive 20 to the processor 22. In the example illustrated in FIG. 2, the backplane structure 38 has a vertically elongated rectangular configuration, with a front side 46 from which a vertically spaced array of five electrical connectors 48 (one for each of the five storage drives 20) forwardly project. In some examples, the backplane structure 38 is omitted and cables (e.g., SAS cables, SATA cables, GenZ cables, etc.) may be directly connected to each bay assembly 60 or to each drive 20 to provide electrical connectivity to the drives 20. In some examples, the electrical connectors 48 are blind mate connectors that are aligned with the bay and located so as to mate with a connector of the drive 20 as the drive 20 is slid into the bay assembly 60. In other examples, the bay assembly 60 may include an electrical connection assembly 49 (see FIGS. 5 and 6) that is to provide an electrical connection between the drive 20 and the backplane structure 38 or an electrical cable, in which case the electrical connectors 48 are not directly connected to the drives 20. For example, the electrical connection assembly 49 may include a blind mate electrical connector 50 to mate with the connector of the drive 20 as it is slid into the bay and a rear connector 51 that is connected to the electrical connectors 48 of the backplane structure 38.

In some examples, the storage drives 20 may be attached to a drive carrier 21 prior to being installed in a bay assembly 60. The drive carrier 21 may provide, for example, alignment features to engage with the alignment features of the bay assembly 60, electromagnetic interference (EMI) fingers to provide EMI shielding, buttons (e.g., eject button), status indicators (e.g., lights, LEDs, etc.), or other features. The drive carrier 21 may also include electrical connectors to mate with the backplane connectors 48, the connector 50, or a cable. The connectors of the drive carrier 21 may be connected to the connectors of the drive 20, such that communication with the drive 20 passes through the connectors of the drive carrier 21. This may be beneficial, for example, when the connectors of the drive 20 are not suitable for blind-mate connecting, in which case the connectors of the drive carrier 21 may be blind-mate connectors that enable the drive 20 to be blind-mate installed in the bay. Thus, descriptions above of how the backplane connectors 48, connectors 50, or cables may connect to electrical connectors of the drive 20 should be understood as also applying to the backplane connectors 48, connectors 50, or cables being connected to electrical connectors of the drive carrier 21.

Each bay assembly 60 (one of which is illustrated removed from the cage structure 24) includes three main parts: a bay structure 68, a connecting bracket 75, and a heat transfer device 72. In some examples, the bay assembly 60 may also include an electrical connection assembly 49, as noted above, which provides electrical connections to drive 20. The bay structure 68 is affixed within the cage structure 24 and defines a bay in which one of the storage drives 20 may be removably installed. When a storage drive 20 is installed in the bay, the drive 20 is supported by the bay structure 68 in a manner that enables installation and removal of the storage drive 20 in accordance with the principles disclosed herein. Additionally, the bay structure 68 may facilitate blind-mate connection of the storage drive 20 by guiding the storage drive 20 into a specific position as it is slid into the bay, thereby enabling mating of an electrical connector of the drive 20 with a corresponding backplane connector 48 or connector 50. The connecting bracket 75 moves the heat transfer device 72 between an engaged position in which it thermally couples with a drive 20 in the bay and a disengaged position. The heat transfer device 72 removes heat from the drive 20 when in the engaged position. These structures will be described in greater detail below with reference to FIGS. 3-6. It will be understood that example embodiments as discussed herein are not limited to only hot-pluggable storage drives 20 and are equally applicable to other types of hot-pluggable devices without departing from the scope of the disclosure.

Figure 3:
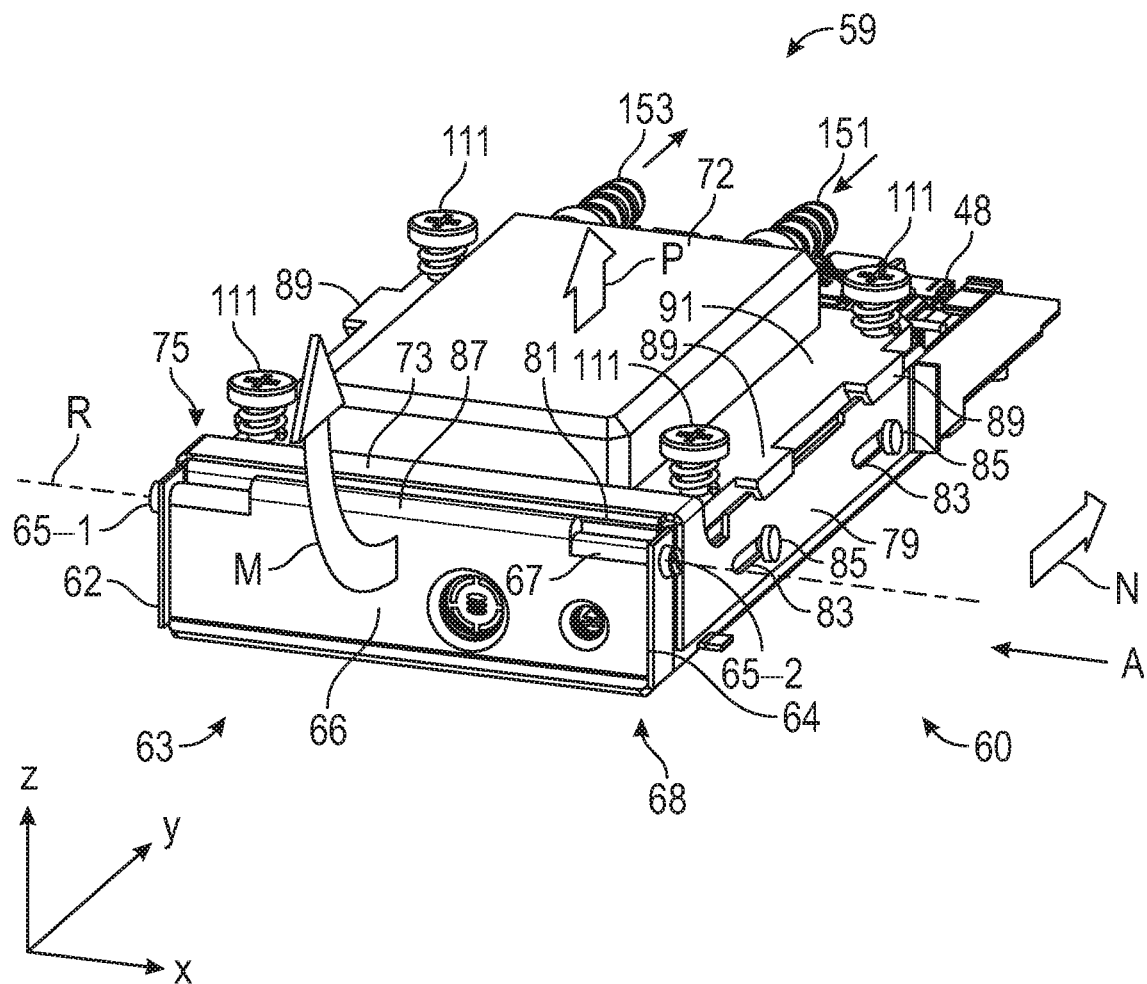
FIG. 3 is a perspective view of the bay assembly with a disk drive installed therein, according to example embodiments.
Figure 4:
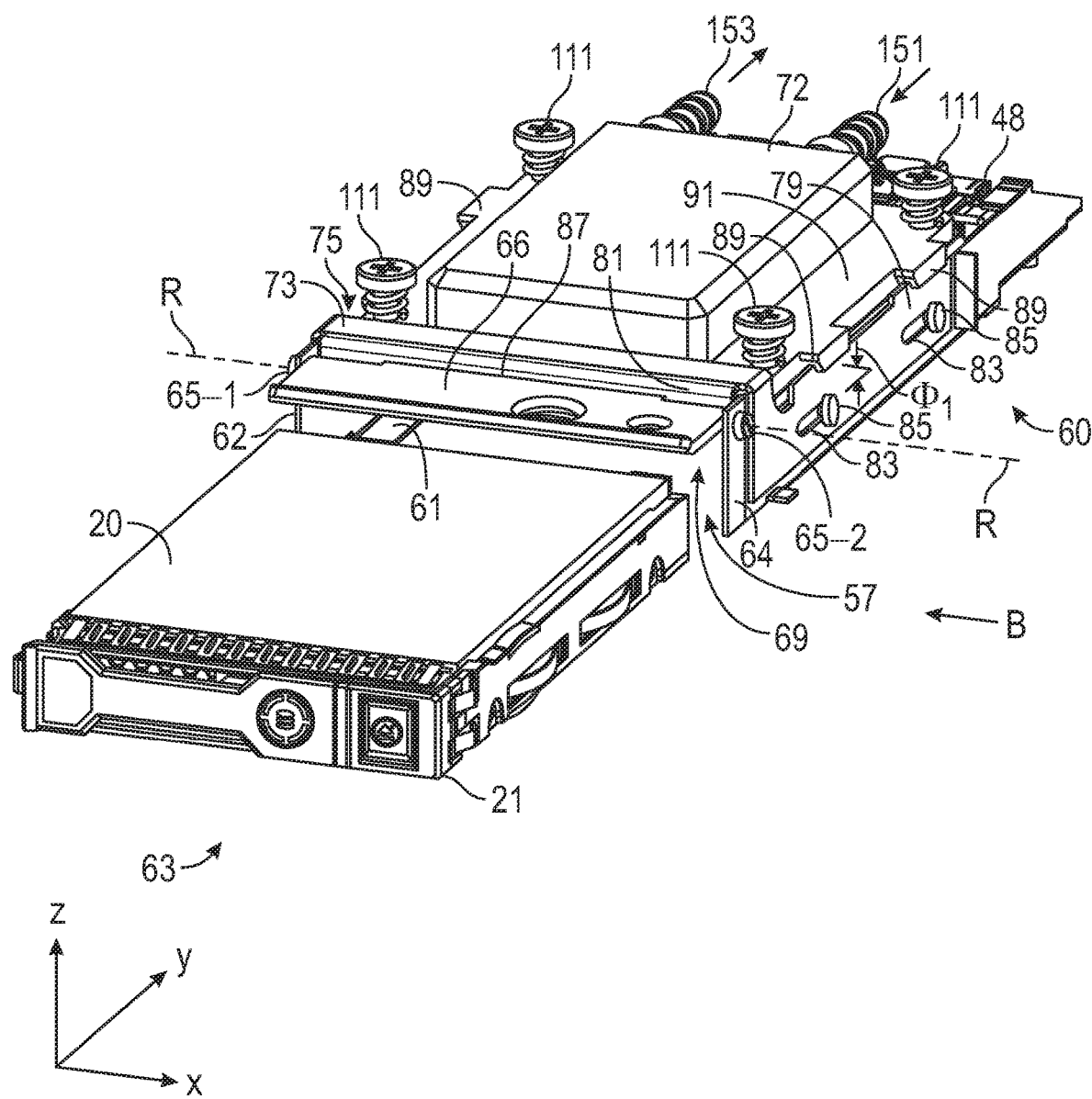
FIG. 4 is a perspective view of the bay assembly in FIG. 3 and the disk drive in FIG. 3 removed from the bay assembly.

FIG. 3 is a perspective view of the bay assembly 60 with a storage drive 20 installed therein, according to example embodiments. FIG. 4 is a perspective view of the bay assembly 60 and the storage drive 20 depicting the storage drive 20 as removed from the bay assembly 60 (note that the cage structure 24 is omitted from the views in FIGS. 3-6 to avoid obscuring details). As noted above, the bay structure 68 may include alignment/support features (such as flanges, grooves, rails, etc.) that guide the storage drive 20 into a desired position as it is slid into the bay and/or that support the storage drive 20 when it is installed. The alignment/support features may, for example, guide the storage drive 20 into a desired position as the drive 20 is slid into the bay. For example, the alignment/support features may include flanges 61 illustrated in FIG. 4 (only one is visible in FIG. 4, but a similar one could be located on an opposite side of the bay).

Referring to FIGS. 3 and 4, the bay structure 68 is a generally rectangular structure having a front end 63 and a rear end 59 longitudinally (Y direction in FIG. 3) opposite the front end 63. The bay structure 68 includes a left sidewall 62 and a right sidewall 64. The left sidewall 62 and the right sidewall 64 both extend longitudinally between the front end 63 and the rear end 59 and the right sidewall 64 is disposed opposite the left sidewall 62. The left sidewall 62 and the right sidewall 64 are spaced apart from each other by a distance that can accommodate the storage drive 20. The bay structure 68 further includes a rectangular front plate 66 coupled to front ends of the left sidewall 62 and the right sidewall 64. The front plate 66 is rotatably coupled to the left sidewall 62 and the right sidewall 64 via hinges 65-1 and 65-2 (hereinafter, collectively referred to as hinges 65), respectively. As illustrated, the hinges 65 are located along a longitudinal edge 67 of the front plate 66 and define the axis of rotation R of the front plate 66. The front plate 66 includes a protrusion 87 that extends a certain distance from the axis of rotation R and beyond the longitudinal edge 67. As described in greater detail below, the protrusion 87 acts as a cam, which translates rotation of the front plate 66 into lateral movement of the connecting bracket 75.

The left sidewall 62, the right sidewall 64, and front plate 66 cooperatively define an interior space 69 (FIG. 4), also referred to herein as a "bay", that is sized or shaped (or otherwise configured) to receive the storage drive 20. The front plate 66 operates as a flap that rotates (indicated by arrow M) about the hinges 65 to provide an opening 57 for accessing the interior space 69. The left sidewall 62 includes a flange 61 (FIG. 4) that extends a certain distance into the interior space 69 from a lower edge of the left sidewall 62. The right sidewall 64 also includes a flange (hidden in view in FIG. 4) that extends a certain distance into the interior space 69 from a lower edge of the right sidewall 64. The flanges provide support to the storage drive 20 when installed in the bay assembly 60.

The bay assembly 60 also includes a connecting bracket 75 that is arranged above and along the left sidewall 62 and the right sidewall 64. The connecting bracket 75 includes a longitudinally extending left plate (hidden in view in FIGS. 3 and 4) disposed parallel to the left sidewall 62 and on a side of the left sidewall 62 opposite the interior space 69. The connecting bracket 75 also includes a longitudinally extending right plate 79 disposed parallel to the right sidewall 64 and on a side of the right sidewall 64 opposite the interior space 69. The right plate 79 includes longitudinal channels 83 (two shown) each of which is sized and shaped to receive a fastener 85 such a bolt to couple the right plate 79 to the right sidewall 64. The right plate 79 (and thereby the connecting bracket 75) is movably coupled by fasteners 85 in its channels 83 to the right sidewall 64 and, as discussed below, translates (e.g., move back and forth) along the right sidewall 64. The left plate is also similarly coupled to the left sidewall 62 by fasteners 85 in its channels 83 and translates along the left sidewall 62. The longitudinal channels 83 and the fasteners 85 cooperate to limit a vertical movement of the connecting bracket 75 relative to the bay structure 68. In other words, the longitudinal channels 83 and the fasteners 85 constrain the movement of the connecting bracket 75 to substantially one dimension (e.g., horizontal movement).

The connecting bracket 75 also includes a transverse section 73 that is located above the left plate and the right plate 79, and that connects the front ends of the left plate and the right plate 79 to each other. The transverse section 73 includes a contacting portion 81 at a front edge thereof. The contacting portion 81 protrudes longitudinally a certain distance from the transverse section 73 towards the front end 63 and contacts (FIG. 5) the longitudinal edge 67 of the front plate 66.

A heat transfer device 72 is arranged on the left sidewall 62 and the right sidewall 64. In an example, and as illustrated, the heat transfer device 72 is a cold plate to transfer heat into a liquid coolant of a liquid cooling system. The heat transfer device 72 includes laterally extending supports (or prongs) 89 that protrude from a base 91 of the heat transfer device 72. The supports 89 are supported by the left sidewall 62 and the right sidewall 64. Each support 89 includes a lateral surface 93 (FIGS. 5 and 6) at a front end thereof. The lateral surface 93 is sloped (ramped), meaning it is disposed at an angle (pi relative to the horizontal (XY) plane that is between 0° and 90°.

The heat transfer device 72 is coupled to the left sidewall 62 and the right sidewall 64 via spring loaded fasteners 111 that can be adjusted to apply a downward spring force on the heat transfer device 72 to maintain a contact between the heat transfer device 72 and the upper surface of the storage drive 20 when the storage drive 20 in positioned in the bay assembly 60. More specifically, in some examples, a thermal interface material 121 (FIG. 6) is arranged between the storage drive 20 and the heat transfer device 72. The thermal interface material 121 may enable and enhance heat transfer between the heat transfer device 72 and the storage drive 20. The thermal interface material 121 is made of a resilient material that is also a good thermal conductor. The spring loaded fasteners 111 apply a spring force to compresses the thermal interface material 121 on to the storage drive 20. The thermal interface material 121 may be or include commercially available thermal interface materials, such as thermal pads (aka gap pads), thermal pastes, thermal greases, etc. In some examples, the thermal interface material 121 may be disposed on the drive 20, or omitted entirely. Disposing the thermal interface material 121 on the heat transfer device 72 may, in some circumstances, reduce the risk that the thermal interface material 121 is damaged while the drive 20 is installed in the bay.

The heat transfer device 72 includes one or more (one illustrated) fluid inlets 151 and one or more (one illustrated) fluid outlets 153 for circulating the coolant in the heat transfer device 72. During operation, coolant enters the heat transfer device 72 via the inlet 151. Heat from the storage drive 20 increased the temperature of the coolant in the heat transfer device 72. The heated coolant exits the heat transfer device 72 via the outlet 153 and is provided to a cooling system that cools the coolant for recirculation into the heat transfer device 72. As a result, heat generated by the storage drive 20 is dissipated. In an example, the cooling system may include a heat exchanger (e.g., a radiator) for lowering the temperature of the coolant. In some embodiments, the heat transfer device 72 may be (or may be thermally coupled to) a heat sink of an air cooling system. In other embodiments, the heat transfer device 72 may be a vapor chamber device. In still other embodiments, the heat transfer device 72 may be (or may be thermally coupled to) a system of heat pipes.

Figure 5:
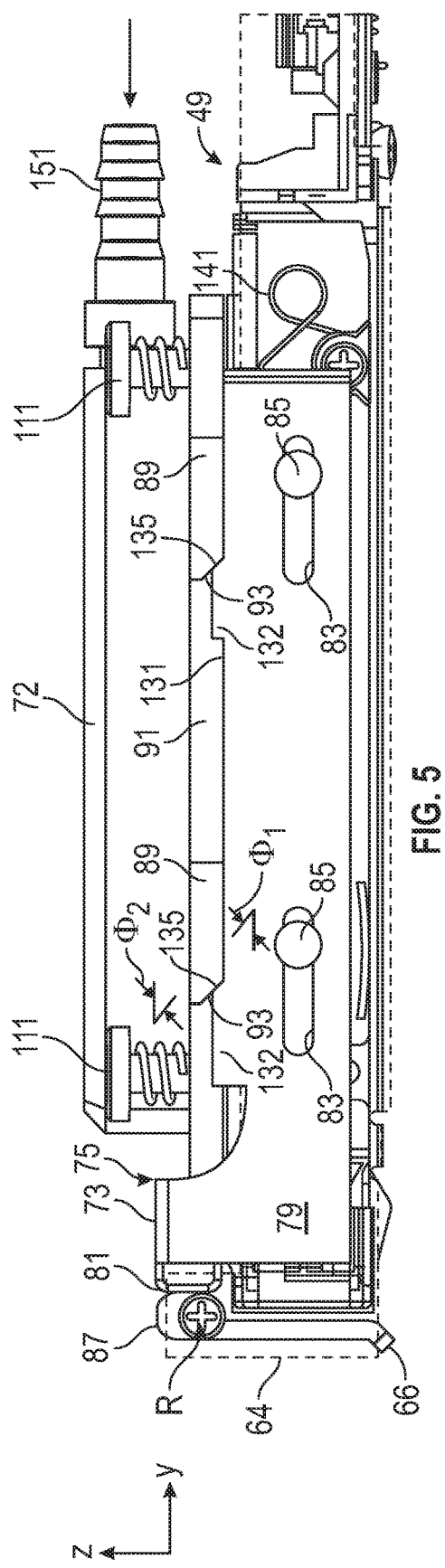
FIG. 5 is a side view of the bay assembly in FIG. 3 including the disk drive installed therein, according to example embodiments.
Figure 6:
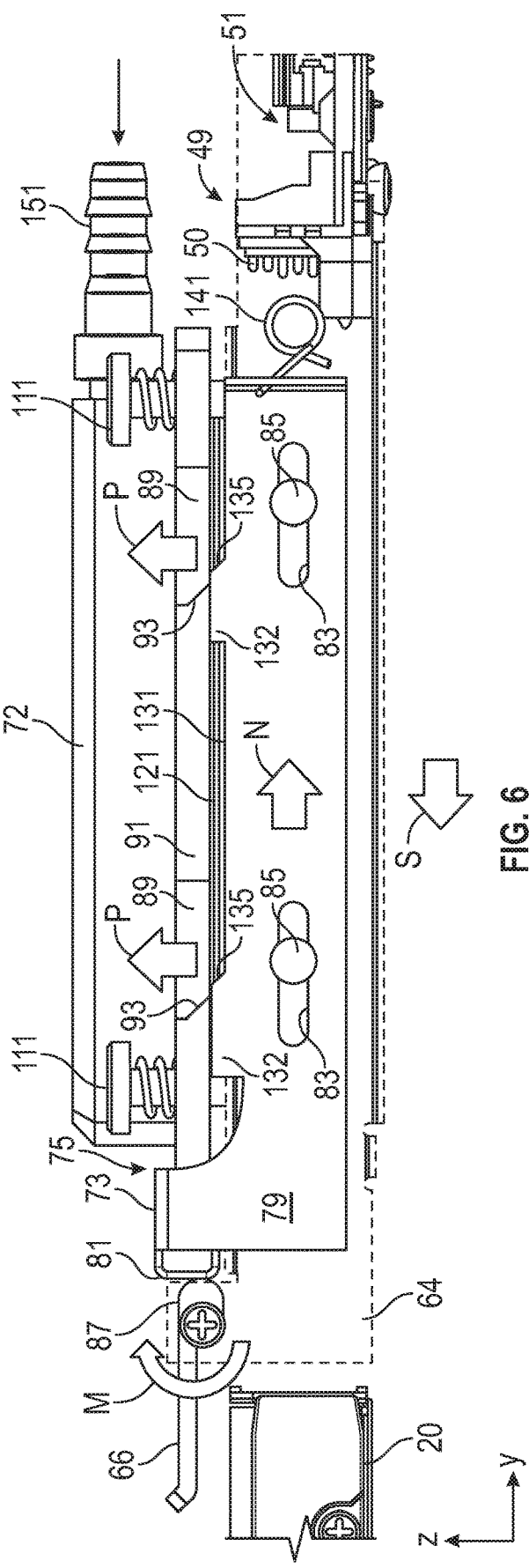
FIG. 6 is a partial side view of the bay assembly in FIG. 4 depicting the disk drive as removed from the bay assembly.

FIG. 5 is a side view (in the direction of arrow A in FIG. 3) of the bay assembly 60 with a storage drive 20 installed therein, according to example embodiments. FIG. 6 is a partial side view (in the direction of arrow B in FIG. 4) of the bay assembly 60 depicting the storage drive 20 as removed from the bay assembly 60. For the sake of illustration and to more clearly illustrate the components present behind the right sidewall 64, the right sidewall 64 is illustrated in phantom (see dashed lines). Referring to FIGS. 5 and 6, with continued reference to FIGS. 3 and 4, the right plate 79 of the connecting bracket 75 includes two (or more) protrusions 132 extending from an upper edge 131 of the right plate 79. The number of protrusions 132 are same as the number of supports 89 of the heat transfer device 72. Each protrusion 132 may include a lateral surface 135 extending from the upper edge 131. The lateral surface 135 may be sloped (ramped), meaning it is disposed at an angle $\varphi_2$ relative to the horizontal (XY) plane that is between 0° and 90°. The left plate of the connecting bracket 75 has a structure similar to the right plate 79 and is hidden in view in FIGS. 5 and 6.

The lateral surface 135 may be complementary to the lateral surface 93, meaning that they face one another and are approximately parallel, with angles from the horizontal ($\varphi_1$ and $\varphi_2$ as defined in FIG. 5) that are equal to one (i.e., $\varphi_1=\varphi_2$). The values of $\varphi_1$ and $\varphi_2$ may be selected so as to obtain a desired mechanical advantage and/or obtain a desired amount of movement of the heat transfer device 72. A higher value of (pi results in more vertical movement of the heat transfer device 72 for a given amount of horizontal movement of the connecting bracket 75, but lower mechanical advantage (i.e., more force needs to be applied). A lower value of $\varphi_1$ results in more less vertical movement of the heat transfer device 72 for a given amount of horizontal movement of the connecting bracket 75, but greater mechanical advantage (i.e., less force needs to be applied). In some examples, the value of $\varphi_1$ may be approximately 45°. In other embodiments, angles $\varphi_1$ and $\varphi_2$ are different. It should be noted that angle $\varphi_1$ and angle $\varphi_2$ can be any angle greater than 0° and less than 90° relative to the horizontal (XY) plane, without departing from the scope of the disclosure.

The lateral surfaces 93 and 135 are examples of linkage features that interact with one another to translate horizontal movement of the connecting bracket 75 into vertical movement of the heat transfer device 72. The connecting bracket 75 and heat transfer device 72 each include multiple pairs of such linkage features, with each pair including one linkage feature from the bracket 75 and one from the heat transfer device 72. In the examples described above and illustrated in the figures, both of the linkage features in each pair comprise two sloped surfaces (i.e., the lateral surfaces 93 and 135), but this is merely one possible example. In other examples, one linkage feature of a given pair could be something other than a sloped surface, such as a rounded surface or a corner (E.g., right angle), while the other surface remains a sloped surface. For example, one of the linkage features could be a cylindrical pin whose round surface interacts with a sloped surface of the other linkage feature.

As another example, one of the linkage features could be a wheel or bearing that rolls along a sloped surface of the other linkage feature.

As illustrated in FIG. 5, when the storage drive 20 is installed in the bay assembly 60, the lateral surface 93 of the support 89 of the heat transfer device 72 contacts the lateral surface 135 of a corresponding protrusion 132. Also, as illustrated, when the storage drive 20 is installed in the bay assembly 60, the front plate 66 is in a vertical closed position that limits access to the interior space 69 and the protrusion 87 on the front plate 66 engages the contacting portion 81 of the connecting bracket 75.

Referring to FIG. 6, in order to remove the storage drive 20 from the bay assembly 60, the front plate 66 is rotated about the hinges 65 (in the direction of arrow M) from a vertical position. Since the protrusion 87 on the front plate 66 is engaged with the contacting portion 81, rotating the front plate 66 causes the protrusion 87 on the front plate 66 to exert a force on the contacting portion 81 and displace the connecting bracket 75 horizontally, as indicated by the arrow N. The front plate 66 with the protrusion 87 functions as a cam for displacing the connecting bracket 75. The horizontal movement of the connecting bracket 75 causes the lateral surface 93 of each support 89 to move relative to the lateral surface 135 of the corresponding protrusion 132. In the illustrated embodiment, the lateral surfaces 93 slide up on the lateral surfaces 135. This causes the heat transfer device 72 to be displaced in a direction transverse (indicated by arrows P) to the direction of displacement (indicated by arrow N) of the connecting bracket 75. By way of example and as illustrated the heat transfer device 72 and the connecting bracket 75 are displaced perpendicular to each other. It will be understood that the movement of the heat transfer device 72 does not include a rotational component. Thus, all points on the heat transfer device 72 move a same distance away from the storage drive 20.

It should be noted that, because the heat transfer device 72 is fixed to the connecting bracket 75 by the spring loaded fasteners 111, movement of the heat transfer device 72 is limited in the horizontal (XY) plane. Further movement of the connecting bracket 75 causes further vertical movement of the heat transfer device 72. When the front plate 66 is in a horizontal open position, as depicted in FIGS. 4 and 6, the connecting bracket 75 is displaced to the right and the supports 89 rest on the protrusions 132. The connecting bracket 75 is maintained in the position depicted in FIG. 6 due to the protrusion 87 pushing against the contacting portion 81.

In this configuration, the thermal interface material 121 is no longer in contact with the storage drive 20 (more specifically, with the top surface of the storage drive 20) and the storage drive 20 can be removed from the bay assembly 60 through the opening 57. By displacing the heat transfer device 72 in this manner, the heat transfer device 72 is moved a lesser distance (compared to rotating the heat transfer device 72 away from the storage drive 20) and the storage drive 20 can be removed without causing damage to the thermal interface material 121.

The bay assembly 60 may include a torsion spring (or a similar device) 141 mounted on the right sidewall 64 and behind the right plate 79. The torsion spring 141 is in contact with the right plate 79 of the connecting bracket 75. A similar torsion spring is mounted on the left sidewall 62 and behind the left plate. The rotation of the front plate 66 causes the connecting bracket 75 to push against the torsion spring 141 and thereby applies a torsional force on the torsion spring 141. However, the torsional force is not sufficient to displace the connecting bracket 75 in the opposite direction (indicated by arrow S in FIG. 6), and, as a result, the connecting bracket 75 is maintained in place.

When installing, the storage drive 20 (or a different hot-pluggable device) is inserted into the interior space 69 through the opening 57 until the storage drive 20 is coupled to the connectors 48. The storage drive 20 is supported by the flanges 61 in the interior space 69. The opening 57 is then closed by rotating (in the direction opposite to the arrow M) the front plate 66 to the vertical closed position. When the front plate 66 is rotated to the vertical closed position, the torsion spring 141 pushes the connecting bracket 75 in the direction of arrow S due to the torsional force. The movement of the connecting bracket 75 causes the lateral surface 93 to slide down over the lateral surface 135, and thereby move the heat transfer device 72 in a downward direction. When the front plate 66 is in the vertical closed position, the thermal interface material 121 contacts the storage drive 20, and the supports 89 contact the upper edge 131 of the right plate 79 and of the upper edge of the left plate.

Example embodiments provide a system that displaces the heat transfer device 72 in a generally vertical direction in order to separate the storage drive 20 from the thermal interface material 121. The heat transfer device 72 has to be displaced a relatively shorter distance to move every point on the thermal interface material 121 a sufficient distance from the storage drive 20 to limit damage to the thermal interface material 121 when removing the storage drive 20. As a result, the heat transfer device 72 and the storage drives 20 can be accommodated in smaller chassis. In contrast, existing systems rotate the heat transfer device separate between the thermal interface material and the storage drive. In such systems, the heat transfer device has to be rotated a greater distance in order to move every point on the thermal interface material a sufficient distance to limit damage to the thermal interface material when removing the storage drive.

Figure 7:
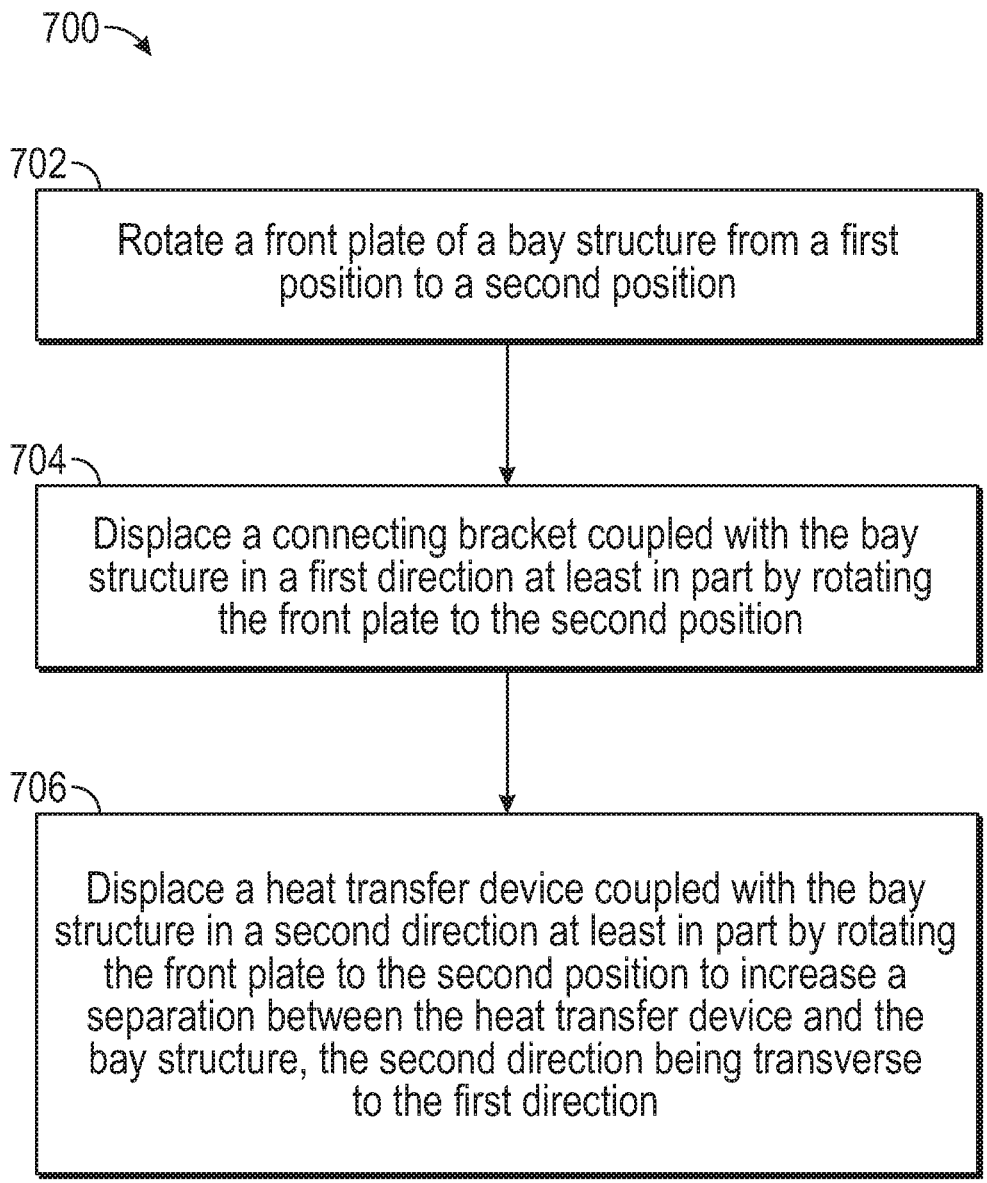
FIG. 7 is a flow chart illustrating steps in a method for operating the bay assembly in FIGS. 3-6, according to some embodiments In the figures, elements and steps denoted by the same or similar reference numerals are associated with the same or similar elements and steps, unless indicated otherwise.

FIG. 7 is a flow chart illustrating steps in a method 700 for operating the bay assembly 60, according to example embodiments. In some embodiments, a method consistent with the present disclosure may include at least one of the steps illustrated for method 700, performed in any order. For example, embodiments consistent with the present disclosure may include one or more steps in method 700 performed in parallel, simultaneously, quasi-simultaneously, or overlapping in time.

Step 702 includes rotating a front plate of a bay structure from a first position to a second position. Step 704 includes displacing a connecting bracket coupled with the bay structure in a first direction at least in part by rotating the front plate to the second position. Step 706 includes displacing a heat transfer device coupled with bay structure in a second direction at least in part by rotating the front plate to the second position to increase a separation between the heat transfer device and the bay structure. The second direction is transverse to the first direction.

Multiple variations and modifications are possible and consistent with embodiments disclosed herein. Although certain illustrative embodiments have been shown and described here, a wide range of modifications, changes, and substitutions is contemplated in the foregoing disclosure. While the above description contains many specifics, these should not be construed as limitations on the scope of the embodiment, but rather as exemplifications of one or another preferred embodiment thereof. In some instances, some features of the present embodiment may be employed without a corresponding use of the other features. Accordingly, it is appropriate that the foregoing description be construed broadly and understood as being given by way of illustration and example only, the spirit and scope of the embodiment being limited only by the appended claims.

What is claimed is:

1. An assembly, comprising: a bay structure that defines a bay for receiving a pluggable module and including a plurality of sides and a front plate rotatably connected to the plurality of sides; a connecting bracket coupled with the bay structure; and a heat transfer device coupled with the bay structure, wherein: the bay structure, the heat transfer device, and the connecting bracket are configured such that rotating the front plate from a first position to a second position displaces the connecting bracket in a first direction which causes the connecting bracket to displace the heat transfer device in a second direction transverse to the first direction, and when displacement of the heat transfer device occurs in the second direction, movement of the heat transfer device in the first direction is restricted or prevented.

2. The assembly of claim 1, wherein rotating the front plate from the first position to the second position causes the heat transfer device to move to a disengaged position in which the heat transfer device does not interfere with the pluggable module being inserted into the bay.

3. The assembly of claim 1, wherein:
the heat transfer device and the connecting bracket are further configured such that rotating the front plate from the second position to the first position displaces the connecting bracket in a third direction opposite the first direction and displaces the heat transfer device in a fourth direction opposite the second direction, and
when displacement of the heat transfer device occurs in the fourth direction, movement of the heat transfer device in the third direction is restricted or prevented.

4. The assembly of claim 3, wherein rotating the front plate from the second position to the first position causes the heat transfer device to move to an engaged position in which the heat transfer device thermally couples with the pluggable module if the pluggable module is in the bay.

5. The assembly of claim 1, wherein:
the connecting bracket includes a left plate and a right plate parallel to and separated from the left plate, each of the left plate and right plate including at least two protrusions extending from an upper edge thereof, each protrusion including a first angled surface, and
the heat transfer device includes a plurality of supports, each corresponding to a protrusion on the connecting bracket, wherein each support includes a second angled surface, and the first angled surface and the second angled surface contacting each other.

6. The assembly of claim 5, wherein rotating the front plate from the first position to the second position displaces the angled first surface and angled second surface relative to each other.

7. The assembly of claim 1, wherein:
the connecting bracket includes a contacting portion,
the front plate includes a protrusion at an end thereof that contacts the contacting portion, and
rotating the front plate from the first position to the second position applies a force on the contacting portion, at least part of the force displacing the connecting bracket in the first direction and displacing the heat transfer device in the second direction.

8. The assembly of claim 1, further comprising at least one torsion spring disposed on the bay structure and contacting the connecting bracket, wherein rotating the front plate from the first position to the second position exerts a force in the torsion spring.

9. The assembly of claim 1, further comprising:
a thermal interface material coupled with the heat transfer device; and
the pluggable module disposed in the bay of the bay structure,
wherein rotating the front plate from the first position to the second position increases a separation between the thermal interface material and the pluggable module, and rotating the front plate from the second position to the first position contacts the thermal interface material with the pluggable module.

10. The assembly of claim 9, wherein the pluggable module is a hot-pluggable storage device.

11. A method, comprising:
rotating a front plate of a bay structure from a first position to a second position;
displacing a connecting bracket coupled with the bay structure in a first direction at least in part by rotating the front plate to the second position; and
displacing a heat transfer device coupled with bay structure in a second direction at least in part by rotating the front plate to the second position to increase a separation between the heat transfer device and the bay structure, the second direction being transverse to the first direction,
wherein when displacement of the heat transfer device occurs in the second direction, movement of the heat transfer device in the first direction is restricted or prevented.

12. The method of claim 11, further comprising:
displacing the connecting bracket in a third direction at least in part by rotating the front plate from the second position to the first position, the third direction being opposite to the first direction; and
displacing the heat transfer device in a fourth direction at least in part by rotating the front plate from the second position to the first position to decrease the separation between the heat transfer device and the bay structure, the fourth direction being opposite to the second direction,
wherein when displacement of the heat transfer device occurs in the fourth direction, movement of the heat transfer device in the third direction is restricted or prevented.

13. The method of claim 12, wherein:
the connecting bracket includes a left plate and a right plate separated from the left plate, each of the left plate and right plate including at least two protrusions extending from an upper edge thereof, each protrusion including an angled first surface, and the heat transfer device includes a plurality of supports, each corresponding to a protrusion on the connecting bracket, and
each support includes an angled second surface, and the angled first surface and angled second surface contact each other, and
the method further comprises:
displacing the angled first surface and angled second surface relative to each other by rotating the front plate in the first direction or in the second direction.

14. The method of claim 11, wherein a pluggable module is disposed in the bay structure, and a thermal interface material is disposed on the heat transfer device and contacts the pluggable module, and the method further comprises:
rotating the front plate from the first position to the second position to separate the thermal interface material and the pluggable module; and
removing the pluggable module from the bay structure.

15. The method of claim 12, wherein a thermal interface material is disposed on the heat transfer device, and the method further comprises:
inserting a pluggable module in the bay structure; and
rotating the front plate from the second position to the first position to contact the thermal interface material with the pluggable module.

16. An assembly, comprising:
a bay structure that defines a bay and includes a front plate rotatably connected to the bay structure;
a hot-pluggable storage device disposed in the bay;
a connecting bracket coupled with the bay structure; and
a heat transfer device coupled with the bay structure,
wherein the bay structure, the heat transfer device, and the connecting bracket are configured such that rotating the front plate in a first direction displaces the connecting bracket in a second direction, displaces the heat transfer device in a third direction while restricting movement of the heat transfer device in the first direction and the second direction, and causes the heat transfer device to move to a disengaged position in which the heat transfer device does not contact the hot-pluggable storage device, and
wherein the third direction is transverse to the second direction.

17. The assembly of claim 16, wherein:
the bay structure, the heat transfer device, and the connecting bracket are further configured such that rotating the front plate in a fourth direction opposite the first direction displaces the connecting bracket in a fifth direction, displaces the heat transfer device in a sixth direction, and causes the heat transfer device to move to an engaged position in which the heat transfer device thermally couples with the hot-pluggable storage device, and
the fifth direction is transverse to the sixth direction.

18. The assembly of claim 16, wherein:
the connecting bracket includes a left plate and a right plate and the hot-pluggable storage device is disposed between the left plate and right plate, each of the left plate and right plate including at least two protrusions extending from upper edges of the left plate and right plate, and each protrusion including a first angled surface, and
the heat transfer device includes a plurality of supports, each corresponding to a protrusion on the connecting bracket, wherein each support includes a second angled surface, and the first angled surface and the second angled surface contacting each other.

19. The assembly of claim 16, wherein:
the front plate including a protrusion at an end thereof that contacts the connecting bracket, and
rotating the front plate in the first direction applies a force on the connecting bracket, the force at least in part displacing the connecting bracket in the second direction and displacing the heat transfer device in the third direction.

20. The assembly of claim 16, further comprising at least one torsion spring disposed on the bay structure and contacting the connecting bracket, wherein rotating the front plate in the first direction exerts a force in the torsion spring.

* * * * *